(12) United States Patent
Infantolino et al.

(10) Patent No.: US 6,747,331 B2
(45) Date of Patent: Jun. 8, 2004

(54) METHOD AND PACKAGING STRUCTURE FOR OPTIMIZING WARPAGE OF FLIP CHIP ORGANIC PACKAGES

(75) Inventors: William Infantolino, Vestal, NY (US); Li Li, Plano, TX (US); Steven G. Rosser, Owego, NY (US); Sanjeev Balwant Sathe, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/197,335

(22) Filed: Jul. 17, 2002

(65) Prior Publication Data

US 2004/0012086 A1 Jan. 22, 2004

(51) Int. Cl.⁷ .............................................. H01L 31/00
(52) U.S. Cl. ...................... 257/457; 257/108; 257/106
(58) Field of Search ................................ 438/457, 108, 438/106

(56) References Cited

U.S. PATENT DOCUMENTS

| | | | |
|---|---|---|---|
| 3,611,317 A | 10/1971 | Bonfeld | |
| 4,868,634 A | 9/1989 | Ishida et al. | |
| 6,188,582 B1 | 2/2001 | Peter | |
| 6,303,998 B1 * | 10/2001 | Murayama | 257/778 |
| 6,566,234 B1 * | 5/2003 | Capote et al. | 438/458 |

FOREIGN PATENT DOCUMENTS

EP 294 015 B1 12/1988

* cited by examiner

Primary Examiner—Luan Thai
(74) Attorney, Agent, or Firm—Scully, Scott, Murphy & Presser; William H. Steinberg

(57) ABSTRACT

An electronic packaging structure and method of forming thereof wherein the structure is constituted of a modular arrangement which reduces stresses generated in a chip, underfill, and ball grid array connection with a flexible substrate in the form of an organic material, which stresses may result in potential delamination due to thermally-induced warpage between the components of the modular arrangement.

5 Claims, 2 Drawing Sheets

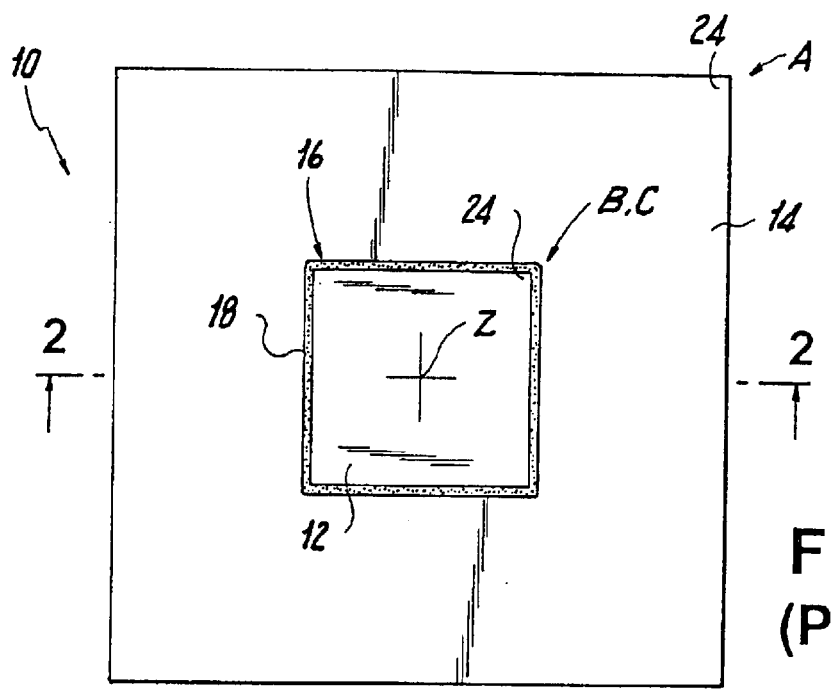
Figure 1
(Prior Art)
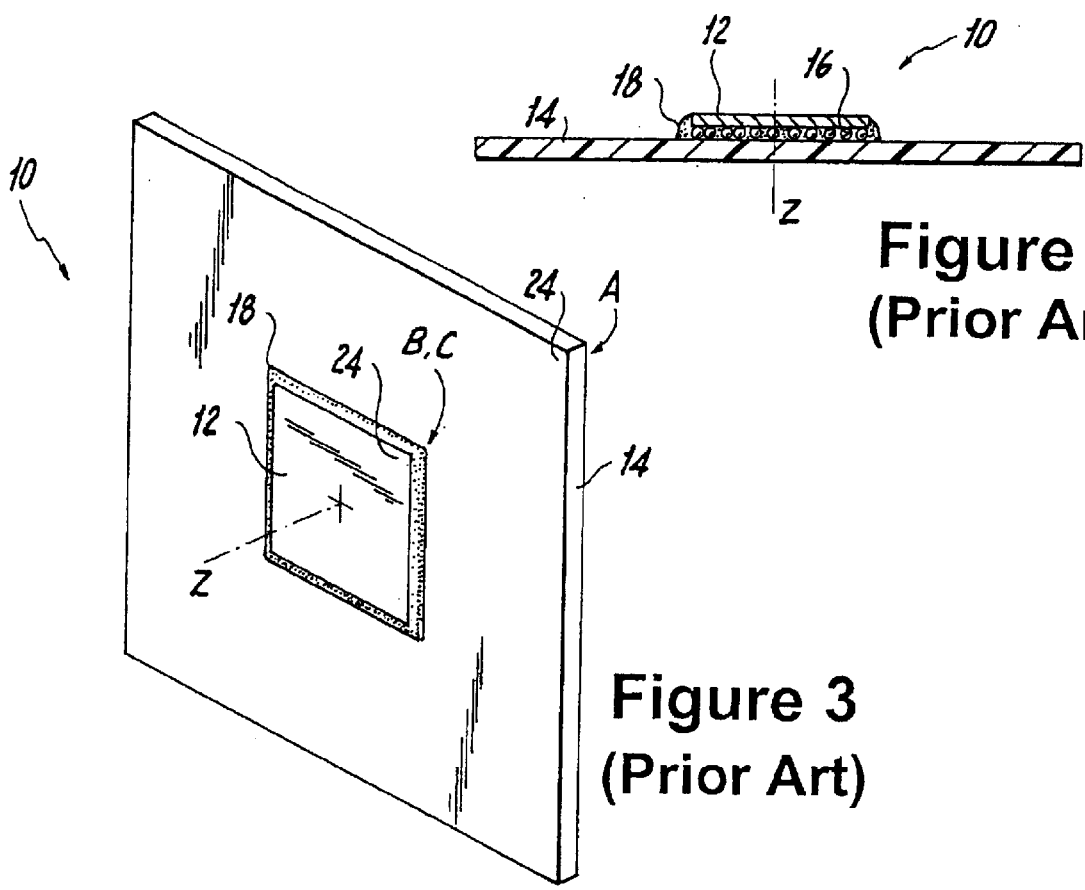
Figure 2
(Prior Art)
Figure 3
(Prior Art)

METHOD AND PACKAGING STRUCTURE FOR OPTIMIZING WARPAGE OF FLIP CHIP ORGANIC PACKAGES

BACKGROUND OF THE INVENTION

1. Field of the Invention

The present invention relates to an electronic packaging structure constituted of a modular arrangement which reduces stresses generated in a chip, underfill, and ball grid array connection with a flexible substrate in the form of an organic material, which stresses may result in potential delamination due to thermally-induced warpage between the components of the modular arrangement.

In the current technology the utilization of flip chips which are mounted on an organic substrate of electronic packaging modules is subject to a tendency of the module components to warp at lower temperatures subsequent to cooling down from the cure temperature of an underfill between the components, and during temperature cycling of the modular package. This warpage of the components such as the chips and substrate, is caused by the considerable differences in the coefficients of thermal expansion (CTE) between the essentially silicon material of the chips, which may possess a CTE of 3 ppm/° C., and that of the circuitized chip carrier or substrate which is normally basically consistent of an organic material or laminate such as an epoxy, possessing a CTE of approximately 18 ppm/° C. Moreover, the encountered warpage is also increased as a result of the extensive mechanical coupling between the components which is introduced through the use of the underfill encapsulation. Moreover, the bending stiffness of respectively the chip, underfill encapsulant and of the organic material forming the chip carrier or substrate, is also of an important consideration in determining the potential warpage of the module.

Extremely severe module warpage can readily result in chip cracking, solder mask and circuit line cracking, underfill delamination and the like rendering the electronic package subject to failure in operation. Thus, when the module is attached, for example, to a printed circuit board (PCB) through the employment of solder joints, extremely high extra loads through the solder joints are necessary in order to force the module to conform with the printed circuit board. This effect causes more stresses to be imparted to the solder joints, and may result in reliability problems for the electronic package. Inasmuch as, increasingly, organic packaging is employed in this technology, it is economically extremely important for module reliability and acceptance in the electronic packaging industry to be able to reduce the deleterious thermally-induced warpage which is encountered in producing the electronic packages having organic substrates or carriers mounting chips, such as flip chips, with bonding thereof through the interposition of thermally curable underfill adhesions.

2. Discussion of the Prior Art

Although consideration has been given to some extent in the technology to reducing stresses which are encountered between chips and organic substrates caused by thermal cyclings and differences in the coefficients of thermal expansion resulting in warpage and delamination between the components, these have not always been adequately successful in the treatment and elimination of this encountered problem.

Ishida et al. U.S. Pat. No. 4,868,634 (and counterpart EP 0 294 015 B1) each relate to an arrangement of memory chips on a card which simplifies the connection to the wiring busses on the card. The primary problems solved by this prior art are to (1) eliminate the need for double sided wiring and plated through holes (PTHs) on a memory card with higher chip density, and/or (2) eliminate the need for large spaces between the chips when a single sided wiring configuration is used. The main benefits are to reduce the cost of the circuit card and/or to increase the memory chip density. The angled orientation of the chip allows simplified connection of the data busses to common locations on the chip and it is not the object of the prior art publications to reduce stress in the chip, underfill, laminate or ball grid arrays (BGAs) as in the present invention. In fact, because of the nature of the multiple chips on a large card with no BGA type attached, the stress would be similar for the angled and straight chip arrangements in this type of prior art construction, whereas the invention is different from these structures in that (1) the purpose of rotating the chip is to obtain a stress reduction, not wiring ease/cost and (2) the stress reduction is in the module/BGA structure and would not apply to the large memory card format.

Bonfeld U.S. Pat. No. 3,611,317 relates to an arrangement of chips and circuit lines on a memory card, whereby the chip is angled relative to the edge of the card. The angled orientation of the chip allows simplified connection of the data busses to common locations on the chip. The chip density can be increased by adding additional chips in the interstitial spaces in the array that are in the proper position to pick up the common buss lines that are running along the card. The purpose of the patent is for wiring simplification and increased chip density; and it is not the object thereof to reduce stress in the chip, underfill, laminate or BGAs as in the present invention. Because of the nature of the multiple chips on a large card with no BGA type attach, the stress would be similar for the angled and straight chip arrangements for this prior type of application, whereas contrastingly, the present invention is different from the patent in that (1) the purpose of rotating the chip is stress reduction, not wiring ease/cost and (2) the stress reduction is in the module/BGA structure and would not apply to a large memory card format.

Peter U.S. Pat. No. 6,188,582 B1 relates to a method of interconnecting a chip and substrate with a device which is an alternative to the solder ball connection. The device consists of an array of wires surrounded by a sheath that is oriented perpendicularly between the chip and substrate, with the two ends of the sheath being solder connected to the chip and substrate. However, the wires have a lower stiffness than a solder ball and can more easily bend, which reduces the stress between the chip and substrate due to the CTE mismatch. The chip is oriented with its side parallel to the substrate in this patent, and in which there is no mention of alternative orientations. In contrast, the present invention disclosure uses conventional materials, structures and processes to reduce the stress in the chip, underfill, laminate and BGA joints, whereby the reduced stress emanataes from the 45 degree chip orientation. The present invention differs from the patent in that (1) the invention uses a conventional module and BGA attach structure, materials and processes as opposed to a unique module to card attach structure/process, and (2) the stress reduction is derived from the chip orientation in the present disclosure while the chip orientation is not mentioned in the patent and is shown in a conventional non-rotated format.

SUMMARY OF THE INVENTION

In order to obviate the problems which are encountered in the prior art, whereby it is important to be able to ameliorate or eliminate any chip cracking, underfill delamination, solder mask and circuit line cracking, ball grid array (BGA) fatigue, and any assembly concerns due to BGA planarity, the consequences of differences in the various coefficients of thermal expansion resulting in warpage of the various components tending to adversely affect the reliability of the packaging structure, the module reliability can be drastically improved by essentially rotating the chip about the z axis relative to the carrier or organic substrate on which it is positioned. In effect, mechanical analysis has indicated that within the chip shadow, maximum shear deformation is encountered between the chip and organic carrier, and also the module bending deformation at the maximum distance from a neutral point (DNP). This concept is also applicable to solder joints when the module is attached to a printed circuit board (PCB).

Accordingly, to be able to obviate or eliminate the drawbacks encountered in the prior art, the invention has as its purpose to reduce the stress in chip, underfill, laminate and BGA connections of the module possessing a flexible substrate as in organic package. This in effect, is attained by rotating the chip by preferably an angle of about 45 degrees relative to the substrate, with all other materials, structures and manufacturing processes remaining the same as in the instance of a standard module. This is different from the prior art publications in that they relate to (1) chip orientation only for simplification of wiring and cost reduction of memory cards, and (2) stress reduction in a module resulting from a completely different module attach method (not BGA), and with no change in the chip orientation. The present invention will reduce the stress in C4 attached modules, as well as providing some benefit for back bonded chip modules.

In essence, by appropriately positioning the chip in a rotated position about the z-axis relative to the substrate, it is possible to reduce maximum shear deformation by a significant extent.

Accordingly, it is an object of the present invention to provide a novel electronic packaging structure for optimizing stresses caused by thermally-induced warpage in flip-chip organic packages.

Another object of the invention resides in the provision of an electronic package of the type described herein in which a chip is rotated a predetermined angle about the z-axis relative to an organic substrate or carrier on which the chip is mounted in order to minimize stresses caused by warpage of the components possessing different CTEs resulting from thermal cycling and cooling relative to the underfill cure temperatures encountered in the formation of the electronic package.

BRIEF DESCRIPTION OF THE ACCOMPANYING DRAWINGS

Reference may now be made to the following detailed description of a preferred embodiment of the invention, taken in conjunction with the accompanying drawings; in which:

FIG. 1 illustrates a top plan view of a silicon chip which mounted on an organic substrate, wherein the chip is essentially in parallel relationship therewith as currently in the prior art;

FIG. 2 illustrates a fragmentary sectional view taken along line 2—2 in FIG. 1, shown on a somewhat enlarged scale.

FIG. 3 illustrates a perspective view of the arrangement of FIGS. 1 and 2 showing the package configured as presently employed in the technology;

DETAILED DESCRIPTION OF A PREFERRED EMBODIMENT

Figure 4:
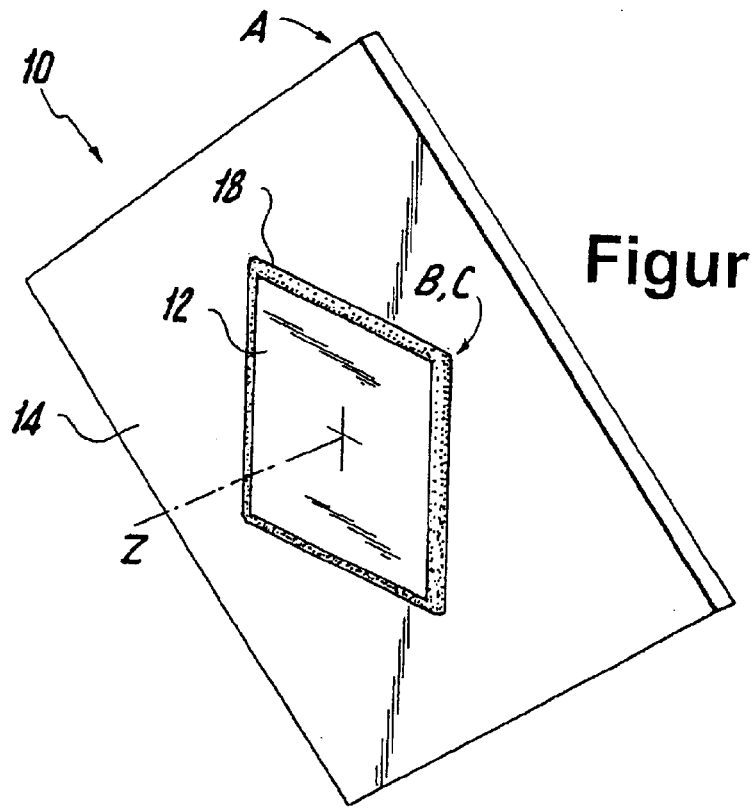
FIG. 4 illustrates a perspective view the novel electronic package configuration in accordance with the present invention.
Figure 5:
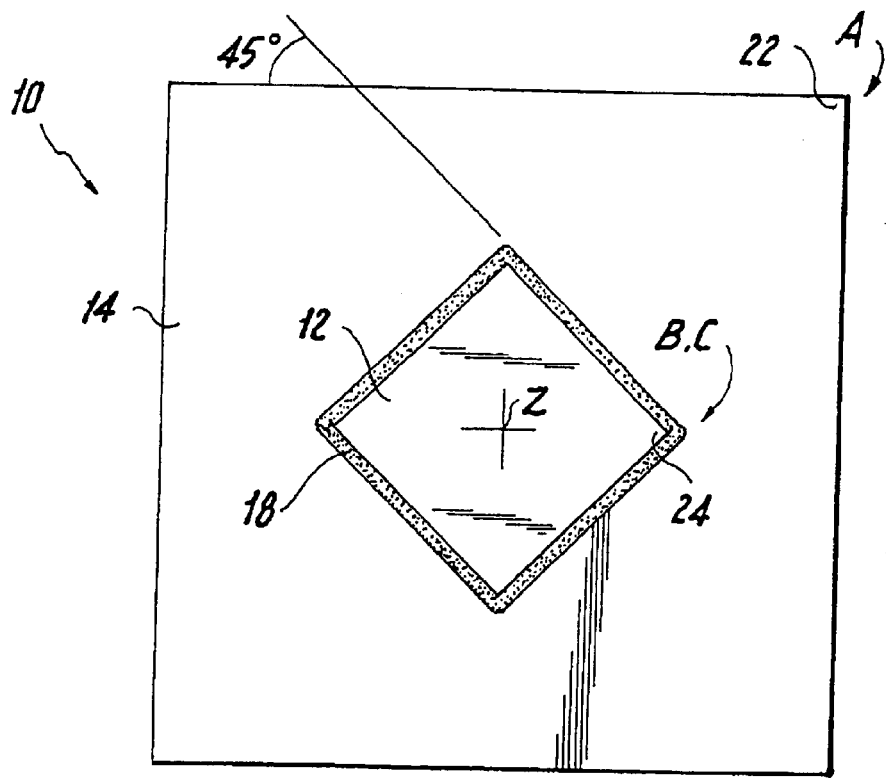
FIG. 5 illustrates a plan view of FIG. 4.

Referring in specific detail to FIGS. 1 and 2 of the drawings, there is illustrated a modular package 10 comprising a silicon chip 12 of essentially a rectangular configuration which is positioned on a laminated substrate 14 comprising a flexible or laminated organic material, such as an epoxy or the like, and attached through the application of suitable solder joint array 16. Intermediate the chip 12 and the module 16 there is provided an underfill material 18 which is constituted of thermally curable adhesive.

In view of the extreme differences in the coefficients of thermal expansion (CTEs) between the silicon chip 12 (3 ppm/° C.) and the organic chip carrier or substrate 14 (18 ppm/° C.), and due to the strong mechanical coupling between these components, introduced by the C4 solder points and encapsulation through the underfill material 18, and predicated on the inherent bending stiffnesses of the chip, underfill and organic carrier materials there is generated a thermal stress resulting in the various warpages of the respective package or module components which could cause delamination thereof and adversely affect the operability and reliability of the electronic package employing these components. Outside of the chip shadow, as shown in FIGS. 1 to 3 of the drawings, at the corner 22 of the substrate 14 or module which is designated as point A, pursuant to the prior art, point B which is a corner 24 of chip 12, and point C which is a C4 solder joint array corner 16, these are superimposed on each other and are aligned with point A. In contrast with the foregoing, pursuant to the invention as shown in FIG. 4, it is intended to rotate points B and C away from critical point A, inasmuch as this can reduce module warpage to an appreciable extent and optimize the stresses imposed on the most critical solder joints.

In order to obviate or improve upon the foregoing arrangement so as to reduce module warpage and improve package reliability, as illustrated in FIG. 4 of the drawings, the chip 12 is rotated about the z axis relative to the organic carrier or substrate 14; preferably through an angle of about 45° whereby the chip corner 24 (point B), C4 solder joint array 16 (point C), which are superimposed on each other, as shown in FIG. 1 and 2, and the corner 22 (point A) of the laminate substrate 14 are now rotated and offset angularly relative to each other.

In effect, the improved electronic package utilizes a similar manufacturing process as does the previous prior art design shown in FIGS. 1 to 3; however the rotation or angular offset of the chip 12 relative to the organic substrate or carrier 14 is proven to be advantageous by mechanical analysis which indicates that within the chip shadow, the maximum shear deformation between the chip 12 and the carrier 14, and also the module bending deformation (utilizing the chip center as a reference or neutral point, all occur at the chip corner point B. This is also true for the solder joints when the module is attached to a printed circuit board, as shown at point A.

Mechanical modeling and analysis has indicted that improvements are obtained by means of the invention with regard to the foregoing, having reference to the following Tables I through III:

TABLE I

| | Module Only | | | | |
|---|---|---|---|---|---|
| | Chip | Underfill | BGA | Laminate | Del Z Disp, mm |
| 0°, % strain | 0.0415 | 0.867 | — | 0.316 | 0.181 |
| 45°, % strain | 0.0400 | 0.716 | — | 0.304 | .0169 |
| % Delta, 45 vs 0 | −3.6 | −17.4 | — | −3.8 | −6.6 |

TABLE II

Single Sided Assembly

|  | Chip | Underfill | BGA | Laminate | Del Z Disp, mm |
|---|---|---|---|---|---|
| 0°, % Strain | 0.0266 | 1.009 | 0.167 | 0.238 | 0.0830 |
| 45°, % Strain | 0.0276 | 0.921 | 0.165 | 0.231 | 0.0784 |
| % Delta, 45 vs 0 | 3.8 | −8.7 | −1.2 | −2.9 | −5.5 |

TABLE III

Double Sided Assembly

|  | Chip | Underfill | BGA | Laminate | Del Z Disp, mm |
|---|---|---|---|---|---|
| 0°, % strain | 0.0320 | 1.274 | 0.495 | 0.588 | 0.0221 |
| 45°, % strain | 0.0319 | 1.158 | 0.431 | 0.587 | 0.0215 |
| % Delta, 45 vs 0 | −0.3 | −9.1 | −12.9 | −0.2 | −2.7 |

As indicated in Table I referring to the module only there is listed the strain and as to chip, underfill, BGA, laminate and delta z displacement in millimeter at 0° rotation, at 45° rotation and % delta strain, and % delta at 45° versus 0° angular offset of chip 12 relative to the substrate or carrier 14.

Also in a single sided modular assembly, Table II illustrates the relative improvement of delta % strain or z-displacement at 45° versus 0° angular displacement, as shown in FIGS. 1 and 2.

In a double sided modular assembly pursuant to Table III, there is also indicated an improvement in stress/strain due to the rotation of the chip 12 relative to the organic substrate or carrier 14.

At a 45° chip orientation, in effect a rotation of the chip 12 about the z-axis relative to the organic substrate 14, there is encountered a reduction of underfill, BGA and laminate strain in comparison with a 0° angular rotation. There is also obtained a reduction of module bending, as measured by the difference in z displacement for all instances. Furthermore, also obtained is a chip strain reduction for the module alone, in which there is encountered a greatest potential for chip cracking. Thus, chip strains are reduced when the module is assembled to a card. The chip strain is slightly higher for the 4520 rotation compared to the zero degree in the instance of only the single sided assembly. However, it is lower than the 0° or the 45° instance in the module only configuration. It is also significantly lower than the chip stress level in the stress screening which is implemented in various versions of such electronic packages.

The actual strain values may also depend on the ratio of chip to laminate thickness, as well as card thickness, whereas the degree of benefit obtained by the invention is somewhat different for various chip, laminate and card combinations.

Thermal modeling has indicated that by means of a thermal analysis, implemented in order to compare the thermal resistance of the two chip orientation designs, the sample chip size was 15 millimeter and the cover plate was 35 millimeter.

A heat flux was applied to the cover plate to simulate two different orientations and with the results showing a nearly insignificant degradation (about 0.5% in thermal resistance for the 45° orientation design). Consequently, this is an acceptable degradation which is more than offset by the advantageous concept of reducing the stresses through the rotation of the chip 12 relative to the organic substrate or carrier 14.

Furthermore, in practically all instances there has been indicated that the failure rate in which chip cracking is encountered is reduced by approximately 7%, while BGA fatigue life has been increased by approximately 21%. Furthermore, no electrical wiring and performance concerns were ascertainable in the utilization of the particular chip rotational position and configuration.

From the foregoing, it is clearly evident there is obtained an improvement in the stress levels and warpage due to the use of the present rotationally offset chip design in comparison with the current state-of-the art.

While the invention has been particularly shown and described with respect to preferred embodiments thereof, it will be understood by those skilled in the art that the foregoing and other changes in form and details may be made therein without departing from the spirit and scope of the invention.

What is claimed is:

1. A method of forming an electronic package, comprising:

providing at least one semiconductor chip having edge portions forming at least one corner point;

providing an organic substrate having edge portions forming at least two corner points at distal edge portions thereof;

and mounting said at least one semiconductor chip in surface-to-surface engagement on said organic substrate such that said at least one corner point of said at least one semiconductor chip is rotated about a z-axis through a neutral point relative to said at least two corner points of said substrate subtending a predetermined angular displacement between the corner points of said organic substrate and the at least one corner point of said at least one semiconductor chip so as to reduce warpage between said at least one semiconductor chip and said organic substrate caused by thermally-induced stresses generated therebetween at said corner points, said at least one corner point on said at least one semiconductor chip being rotated about in the z-axis through said neutral point from at least one corner point on said organic substrate by an angular displacement of about, and said neutral point coinciding with a center point of said at least one semiconductor chip, and a maximum bending shear deformation of said electronic package occurring at least at one corner point of said organic substrate distant from said neutral point (DNP).

2. A method as claimed in claim 1, wherein at least one solder joint array corner point is provided between said at least corner point of said at least one semiconductor chip and said organic substrate, said at least one solder joint array corner point being in superimposed alignment with said at least one corner point of said at least one semiconductor chip.

3. A method as claimed in claim 1, wherein a thermally curable adhesive underfill material is provided between said at least one semiconductor chip and said organic substrate, whereby cooling of said underfill material or thermal cycling of said electronic package generates stresses causing warpage between the components of said package.

4. A method as claimed in claim 1, wherein said at least one semiconductor chip comprises silicon having a coefficient of thermal expansion of about 3ppm/° C.

5. A method as claimed in claim 1, wherein said organic substrate comprises an epoxy having a coefficient of thermal expansion of about 18 ppm/° C.

* * * * *